(12) United States Patent  (10) Patent No.: US 9,331,795 B2
Leuschner et al.  (45) Date of Patent: May 3, 2016

(54) TRANSMISSION ARRANGEMENT AND METHOD FOR ANALYZING AN AMPLIFIED TRANSMISSION SIGNAL

(71) Applicant: Intel Mobile Communications GmbH, Neubiberg (DE)

(72) Inventors: Stephan Leuschner, Munich (DE); Florian Mrugalla, Munich (DE); José Moreira, Munich (DE); Peter Pfann, Munich (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 9 days.

(21) Appl. No.: 14/183,610

(22) Filed: Feb. 19, 2014

(65) Prior Publication Data

US 2014/0314132 A1    Oct. 23, 2014

(30) Foreign Application Priority Data

Feb. 22, 2013 (DE) .......................... 10 2013 101 771

(51) Int. Cl.
*H04B 1/04* (2006.01)
*H04B 17/00* (2015.01)
*H04B 17/13* (2015.01)
*H04B 17/318* (2015.01)
(Continued)

(52) U.S. Cl.
CPC ............. *H04B 17/003* (2013.01); *H04B 1/0458* (2013.01); *H04B 1/0475* (2013.01); *H04B 5/0075* (2013.01); *H04B 17/13* (2015.01); *H04B 17/318* (2015.01); *H04B 2001/0408* (2013.01); *H04W 52/52* (2013.01)

(58) Field of Classification Search
CPC ......... H03F 1/0294; H03F 1/32; H03F 3/211; H03F 1/0205; H03F 3/24; H03F 1/30; H03F 2201/3206; H03F 2200/336; H03F 2203/21142; H03F 1/0277; H03G 3/3042; H03G 1/0088; H03G 3/001; H03G 3/04; H04B 1/04; H04B 1/0483; H04B 3/06; H04B 7/0417; H04B 7/0465; H04B 7/0639; H04B 7/0641; H04B 7/065; H04B 7/066
See application file for complete search history.

(56) References Cited

U.S. PATENT DOCUMENTS 5,905,760 A     5/1999   Schnabl et al.
6,831,510 B2   12/2004   Jiang
6,972,596 B1 * 12/2005   Proebsting ............. H03K 5/003
                                                              326/34

(Continued)

FOREIGN PATENT DOCUMENTS

DE        69709560 T2     8/2002
DE     102004001094 A1    8/2005
(Continued)

OTHER PUBLICATIONS

Office action received for German Patent Application No. 10 2013 101 771.1, mailed on Nov. 7, 2013, 5 pages of office action and 3 pages of English Translation.

(Continued)

*Primary Examiner* — Golam Sorowar

(57) ABSTRACT

A transmission arrangement is disclosed having an amplifier which is set up to amplify a transmission signal and to provide it as an amplified transmission signal in differential form, an analysis circuit for determining a property of the amplified transmission signal, and a differential feedback path which is set up to supply the amplified transmission signal to the analysis circuit in differential form.

21 Claims, 12 Drawing Sheets

(51) Int. Cl.
*H04B 5/00* (2006.01)
*H04W 52/52* (2009.01)

(56) References Cited

U.S. PATENT DOCUMENTS

| | | | |
|---|---|---|---|
| 7,288,991 B2 | 10/2007 | Ripley | |
| 7,446,613 B2 | 11/2008 | Westwick et al. | |
| 7,826,815 B2 | 11/2010 | Ajram et al. | |
| 2004/0155705 A1 | 8/2004 | Jiang | |
| 2006/0181351 A1 | 8/2006 | Ripley | |
| 2008/0139141 A1* | 6/2008 | Varghese et al. | 455/114.3 |
| 2009/0015215 A1 | 1/2009 | Ajram et al. | |
| 2012/0161880 A1* | 6/2012 | Sutardja | H03F 1/223 330/310 |

FOREIGN PATENT DOCUMENTS

| | | |
|---|---|---|
| JP | 2004242319 A | 8/2004 |
| KR | 20070074661 A | 7/2007 |
| TW | 200919929 A | 5/2009 |

OTHER PUBLICATIONS

Office action received for KR Patent Application No. 20140019656, dated Apr. 6, 2015, 7 pages of office action and 5 pages of English translation.

Office Action received for Taiwanese Patent Application No. 103104595 mailed on May 26, 2015, 5 pages of office action and 6 pages of English translation.

* cited by examiner

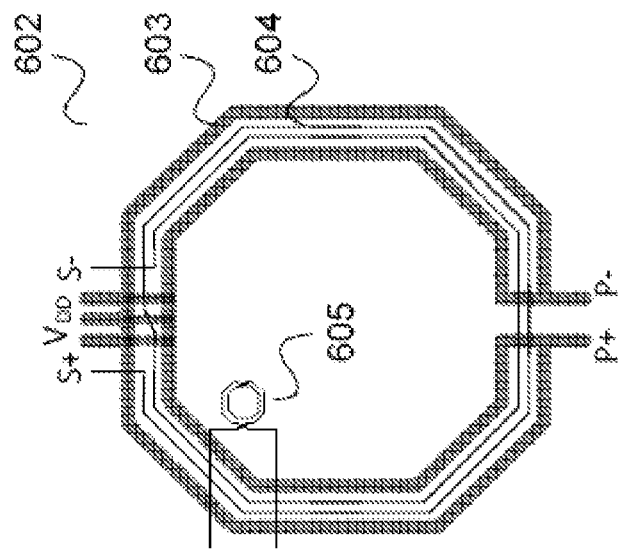
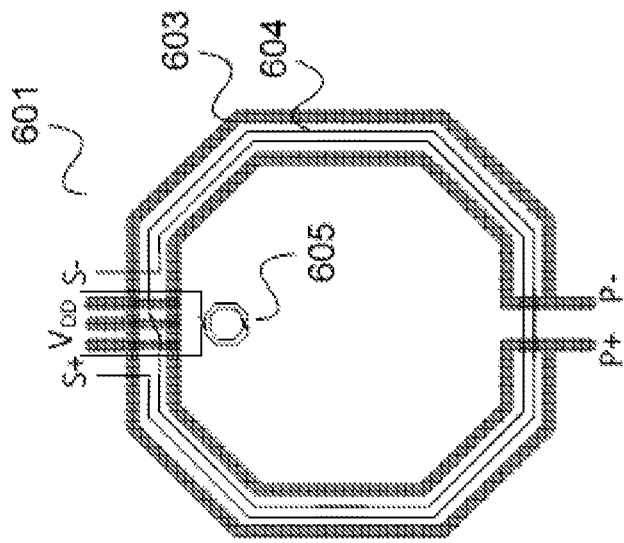
FIG 6

TRANSMISSION ARRANGEMENT AND METHOD FOR ANALYZING AN AMPLIFIED TRANSMISSION SIGNAL

CROSS-REFERENCE TO RELATED APPLICATION

This application claims priority to German Patent Application Serial No. 10 2013 101 771.1, which was filed Feb. 22, 2013, and is incorporated herein by reference in its entirety.

TECHNICAL FIELD

The disclosure generally relates to transmission arrangements and to methods for analyzing an amplified transmission signal.

BACKGROUND

Transmission signals, as are sent by mobile radio transceivers for example, must meet particular requirements, for example with respect to the transmission power. In order to ensure that a transmission signal meets a particular requirement, it is possible to provide, for example, a control loop which feeds the (already amplified) transmission signal back to a component which analyzes the transmission signal and controls the further generation of signals on the basis of the analytical results.

SUMMARY

A transmission arrangement is provided having an amplifier which is set up to amplify a transmission signal and to provide it as an amplified transmission signal in differential form, an analysis circuit for determining a property of the amplified transmission signal, and a differential feedback path which is set up to supply the amplified transmission signal to the analysis circuit in differential form.

A method for analyzing an amplified transmission signal according to the transmission arrangement described above is also provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows transformers with inductive output;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
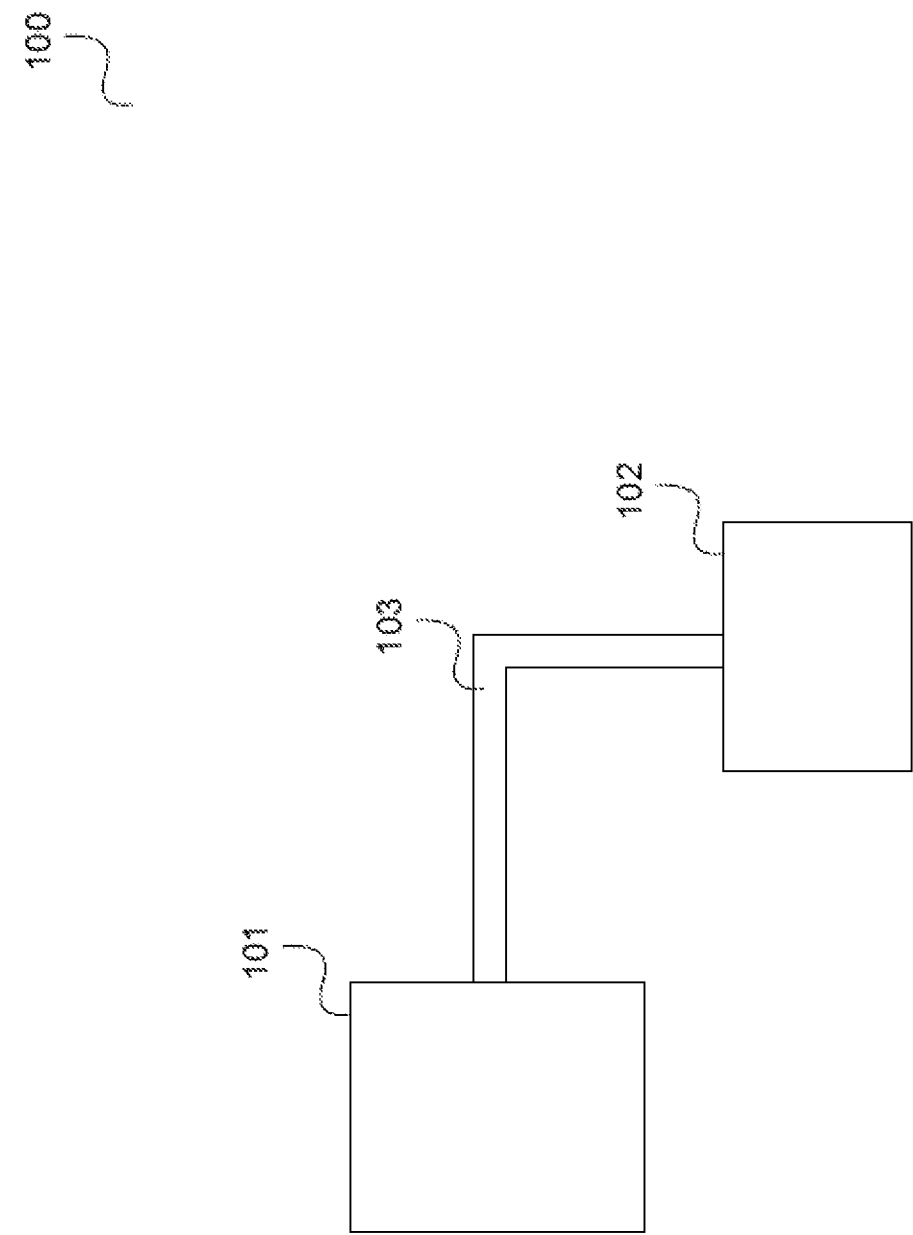
FIG. 1 shows a transmission arrangement.

FIG. 1 shows a transmission arrangement 100.

The transmission arrangement 100 has an amplifier which is set up to amplify a transmission signal and to provide it as an amplified transmission signal in differential form, as well as an analysis circuit 102 for determining a property of the amplified transmission signal.

The transmission arrangement also has a differential feedback path 103 which is set up to supply the amplified transmission signal to the analysis circuit in differential form.

In other words, a transmission signal which is output by an amplifier (for example a transmission output stage) is fed back, in differential form, to an analysis circuit which analyzes the transmission signal, for example determines the transmission power etc. The differential feedback may make it possible, for example, to integrate the analysis circuit and the amplifier on one chip (or at least in one package).

For example, an overall system for on-chip transmission signal measurement and assessment, including or consisting of an integrated transmission device (TX), an integrated power amplifier, an integrated matching network including output and a feedback receiver, is provided. In this case, the form in which the transmission path is implemented is unimportant; both an IQ and a polar modulator TX may be used, for example. The feedback receiver may be designed to be re-configurable using the advantages of CMOS (complementary metal oxide semiconductor) large-scale integration; e.g. a programmable attenuator (capacitive) and a programmable transconductance stage may be implemented in order to enable a high dynamic range. The feedback receiver input may be weakly coupled, with the result that the output does not load the transmission path. Additional filter measures make it possible to necessarily suppress harmonic signal components, for example by means of an additional H3 band-stop filter (that is to say a band-stop filter for suppressing the third harmonic of the transmission frequency). In other implementations, a filter function may be directly integrated in an output structure inside a transformer (for example an output transformer of the amplifier).

The analysis circuit has, for example, a feedback receiver for receiving the amplified transmission signal in differential form.

The feedback receiver and the amplifier may be arranged, for example, in the same package.

The feedback receiver and the amplifier may also be arranged on the same chip.

The transmission signal is, for example, a modulated transmission signal, and the feedback receiver has, for example, a demodulator which is set up to demodulate the amplified transmission signal (supplied to it).

The transmission arrangement also has, for example, a transmission device which is set up to generate the transmission signal.

The transmission device, the analysis circuit and the amplifier are arranged, for example, in the same package.

The transmission device, the analysis circuit and the amplifier may also be arranged on the same chip.

The transmission arrangement may also have, for example, a control device which is set up to control the transmission device for (further) transmission signal generation on the basis of the determined property.

The amplifier is set up, for example, to provide an antenna with the amplified transmission signal.

The differential feedback path may have a filter configured to filter the amplified transmission signal.

The differential feedback path may have an attenuator configured to attenuate the amplified transmission signal.

The transmission arrangement also has, for example, an output element which is set up to output the amplified transmission signal from an output path of the amplifier and to supply it to the feedback path.

The output path may have a matching network and the output element may be set up to inductively output the amplified transmission signal from the matching network.

For example, the matching network is a transformer and the output element is set up to inductively output the amplified transmission signal from the secondary side of the transformer.

The output element may be integrated in the transformer.

The output element has, for example, an output filter.

The output element may be set up to capacitively output the amplified transmission signal.

The amplifier is, for example, an output stage (for example a transceiver output stage).

Figure 2:
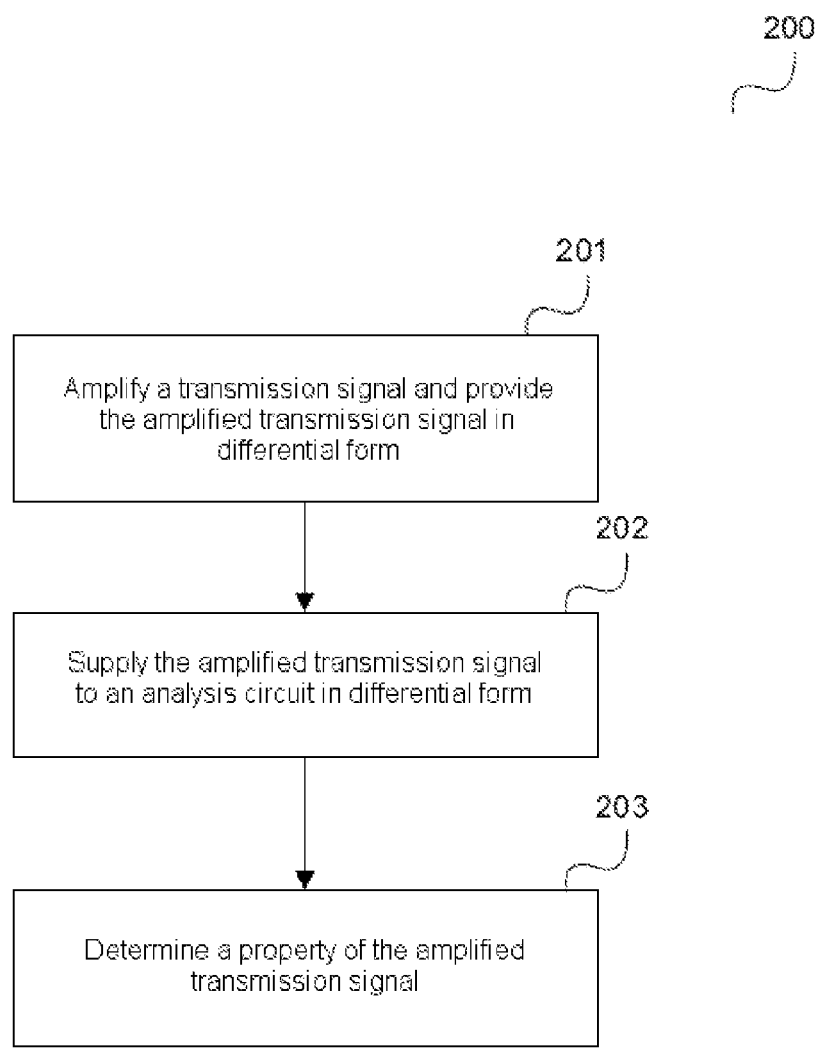
FIG. 2 shows a flowchart.

The transmission arrangement carries out the method illustrated in FIG. 2, for example.

FIG. 2 shows a flowchart 200.

The flowchart shows a method for transmitting a signal, for example carried out by a transmission arrangement.

In 201, a component of the transmission arrangement amplifies a transmission signal and provides the amplified transmission signal in differential form.

In 202, a component of the transmission arrangement supplies the amplified transmission signal to an analysis circuit in differential form.

In 203, the analysis circuit determines a property of the amplified transmission signal.

Examples which are described in connection with the transmission circuit 100 analogously apply to the method illustrated in FIG. 2 and vice versa.

Examples are explained in greater detail below.

A multiplicity of high demands are imposed on modern mobile radio transceivers (TRX). These include, on the one hand, a minimum degree of accuracy with which the transmission power of the transmitter (TX) is set and, on the other hand, a linear transmission behavior which complies with specifications.

The transmission power may be set by means of power control or power regulation. Whereas power control typically imposes enormously high demands on the accuracy of the production processes, power regulation can be used to compensate for precisely such production tolerances. However, the prerequisite for this is typically that of being able to measure the transmission power in the system as accurately as possible. Depending on the design of the overall system, it is possible that it is necessary or desirable to exactly measure not only the forward wave but also the return wave, possibly even in terms of magnitude and phase, in order to obtain information relating to the mismatch to the antenna.

The best possible linearity of the TX path (transmission path) and, in particular, of the power amplifier (PA) is typically also required. PA implementations in modern nm CMOS processes used for SoC (System-on-Chip) large-scale integration generally exhibit a linear behavior that is inferior to that of the stand-alone PAs in III/V semiconductor technologies. Adaptive compensation measures, for example adaptive operating point adjustment or adaptive digital predistortion (DPD) for improving the linear behavior, typically require as accurate knowledge as possible of the distorted transmission signal. This makes it possible to considerably reduce the power consumption of the overall system with a given linearity requirement.

An example of a fully integrated system for highly accurate transmission signal demodulation and transmission power measurement is described below with reference to FIG. 3.

Figure 3:
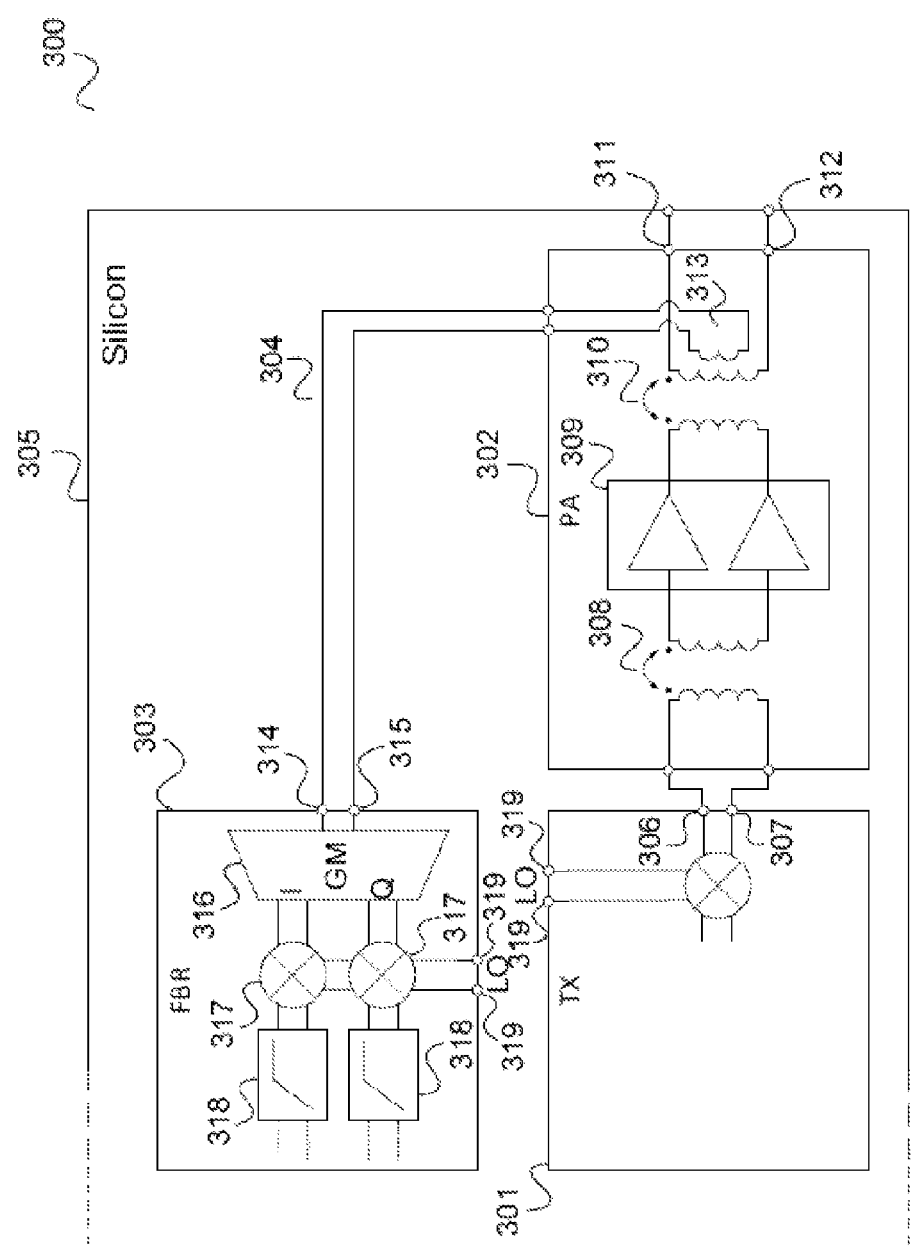
FIG. 3 shows an integrated transmission arrangement.

FIG. 3 shows an integrated transmission arrangement 300.

The transmission arrangement has a transmission device 301 which implements a transmission path (TX path). The transmission arrangement also has (for example for each of a plurality of transmission paths) an integrated (power) amplifier 302 with additional, likewise integrated output of the transmission signal, and an integrated feedback receiver (FBR) 303. The transmission device 301, the amplifier 302 and the feedback receiver 303 as well as the feedback path 304 for feeding the output amplified signal back to the feedback receiver 303 in differential form are integrated together on one chip (monolithic), for example. Alternatively, these components may be partially integrated on different chips. In this case, they are arranged in the same package, for example.

The transmission device 301 provides a modulated transmission signal in differential form at outputs 306, 307. The amplifier 302 amplifies the transmission signal, for example by means of active elements of an amplifier stage 309. The amplifier also has matching networks which are in the form of a first transformer 308 and a second transformer 310, for example, but also in the form of L/Pi-type matching networks, for example. Other matching network topologies are also conceivable (L/Pi match).

The amplifier 302 provides the amplified transmission signal at its outputs, for example for supplying to an antenna.

In addition to matching the output stage (that is to say the amplifier 302) to the load, the second transformer 310 is also used, for example, to generate an asymmetrical RF output signal with a reference to ground from the differential output signal from the power output stage transistors of the amplifier stage 309.

An output element which inductively outputs the amplified transmission signal and supplies it to the feedback path 304 is provided on the secondary side of the second transformer 310. The feedback receiver (FBR) receives the fed-back transmission signal at 314, 315 and processes it, for example by means of a transconductance stage 316, mixers 317, filters 318 etc. Examples of the signal processing by the feedback receiver 303 are explained further below. Both the transmission device 301 and the feedback receiver 303 have inputs for supplying an oscillator signal (LO (local oscillator)) for modulation or demodulation.

The transmission device 301 and the amplifier may also be integrated to form one element, with the result that the corresponding (intermediate) matching network, for example the transformer 308, is superfluous.

Instead of integrating the coupler (that is to say the output element 313) with the components 301, 302, 303, it may be provided as an additional external component. This may be provided as an additional component or may be integrated with the amplifier and possibly other functions in a front-end module (FEM) in the form of SiP (System-in-Package)/SoC, wherein, in the latter case, the number of components does not increase as a result of the coupler, but the costs of the FEM do. In addition, additional inputs for the feedback signal are required in this case on the TRX chip (that is to say the chip having the transmission device 301).

If feedback of the transmission signal is dispensed with, the transmission power can be set only in accordance with calibration information (for example in the form of tables which are stored in a memory of the chip/system) generated during calibration (for example of the modem which contains the transmission arrangement). Unforeseen changes to the operating conditions may result in errors in the transmission power in this case.

It is possible to measure the transmission signal (for example by means of analysis components coupled to the feedback receiver 303) with a high degree of accuracy by means of the output of the (amplified) transmission signal, which is integrated in the amplifier 302, and the dedicated feedback receiver 303.

Board area and the number of discrete subassemblies (and therefore the BoM (Bill of Material)) can be reduced by integrating the components 301, 302, 303. Over the course of full integration, a transmission signal measuring system can be implemented efficiently and with low power consumption.

In the example in FIG. 3, the transmission signal output is integrated, by means of the output element, in the amplifier matching network on the output side (which, in the above example, can be formed by the second transformer 310, which can be considered to be an output transformer, but may also be another matching network) and can be implemented without any additional chip area requirement.

The signal (which has not yet been amplified) can additionally be output on the secondary side of the first transformer 308. The signal output there can likewise be supplied to the feedback receiver in differential form for signal analysis.

Figure 4:
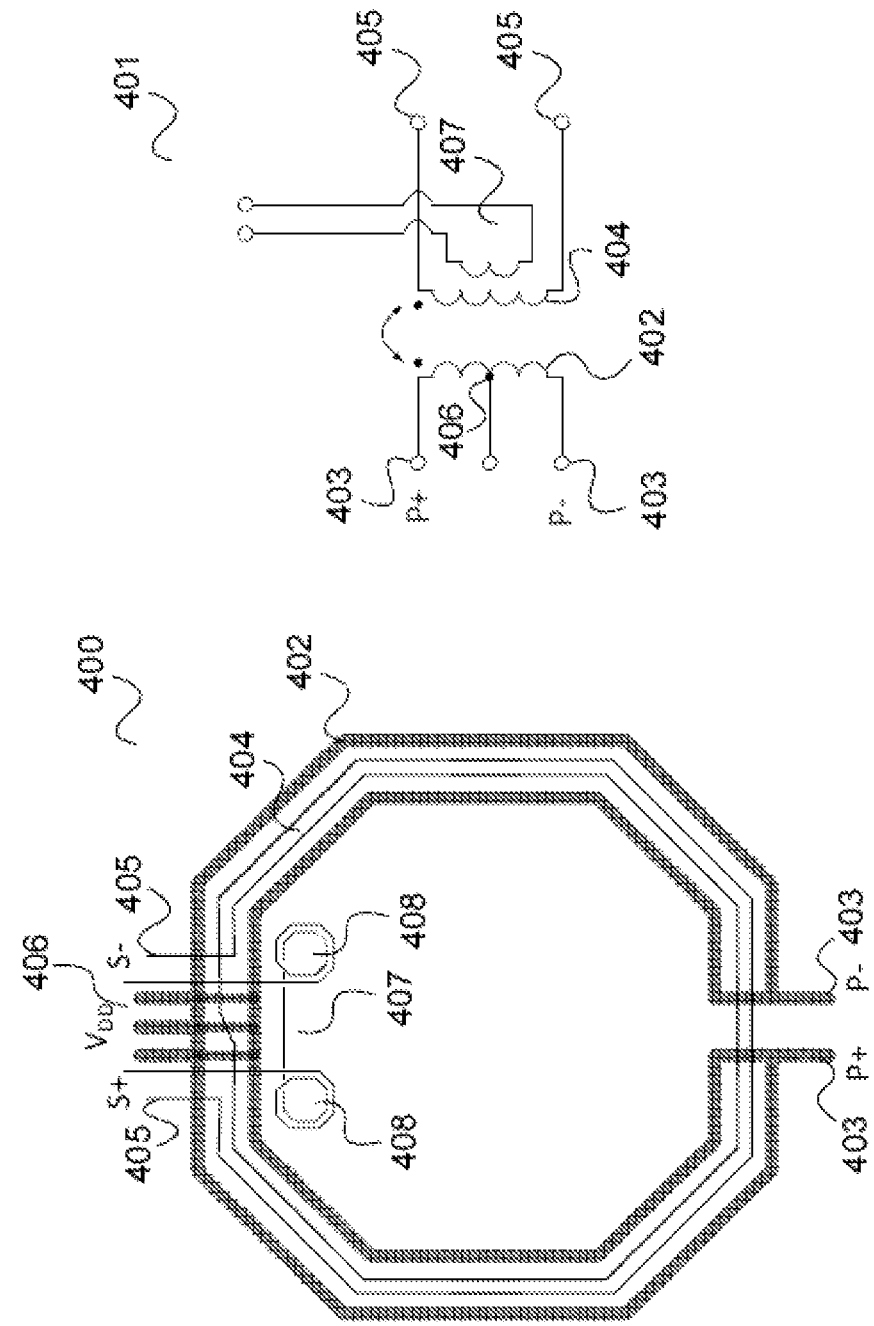
FIG. 4 shows a transformer with inductive signal output and a corresponding equivalent circuit diagram.

In this example, output from the secondary side of the second transformer 313 is effected inductively using one or more conductor loops which are arranged, for example, symmetrically with respect to the structure axis inside the second transformer 310, as is illustrated in FIG. 4 for a situation in which two coils are used for signal output.

FIG. 4 shows a transformer 400 with inductive signal output and a corresponding equivalent circuit diagram 401.

In this example, the transformer has a primary winding 402 with two parallel primary turns. The transformer may also have a different construction, for example with a different number of primary turns or with primary turns connected in a different manner. The primary winding 402 (primary side) has primary-side connections 403. The transformer also has a secondary winding 404 with serial secondary turns. The secondary winding 404 (secondary side) has secondary-side connections 405.

The primary winding 402 has a central connection 406 for the supply voltage (VDD).

For output, the transformer 400 has an output element 407 having two symmetrically arranged inductances 408.

A high-impedance design makes it possible for only a very small part of the transmission power to be output. The efficiency of the amplifier is not impaired in this way. The symmetrical arrangement of the output inductances 408 with respect to the axis of symmetry of the primary winding 402 makes it possible to achieve high common-mode rejection, thus greatly reducing even harmonics in the output signal.

The processing of the output signal is explained in more detail below with reference to FIG. 5.

Figure 5:
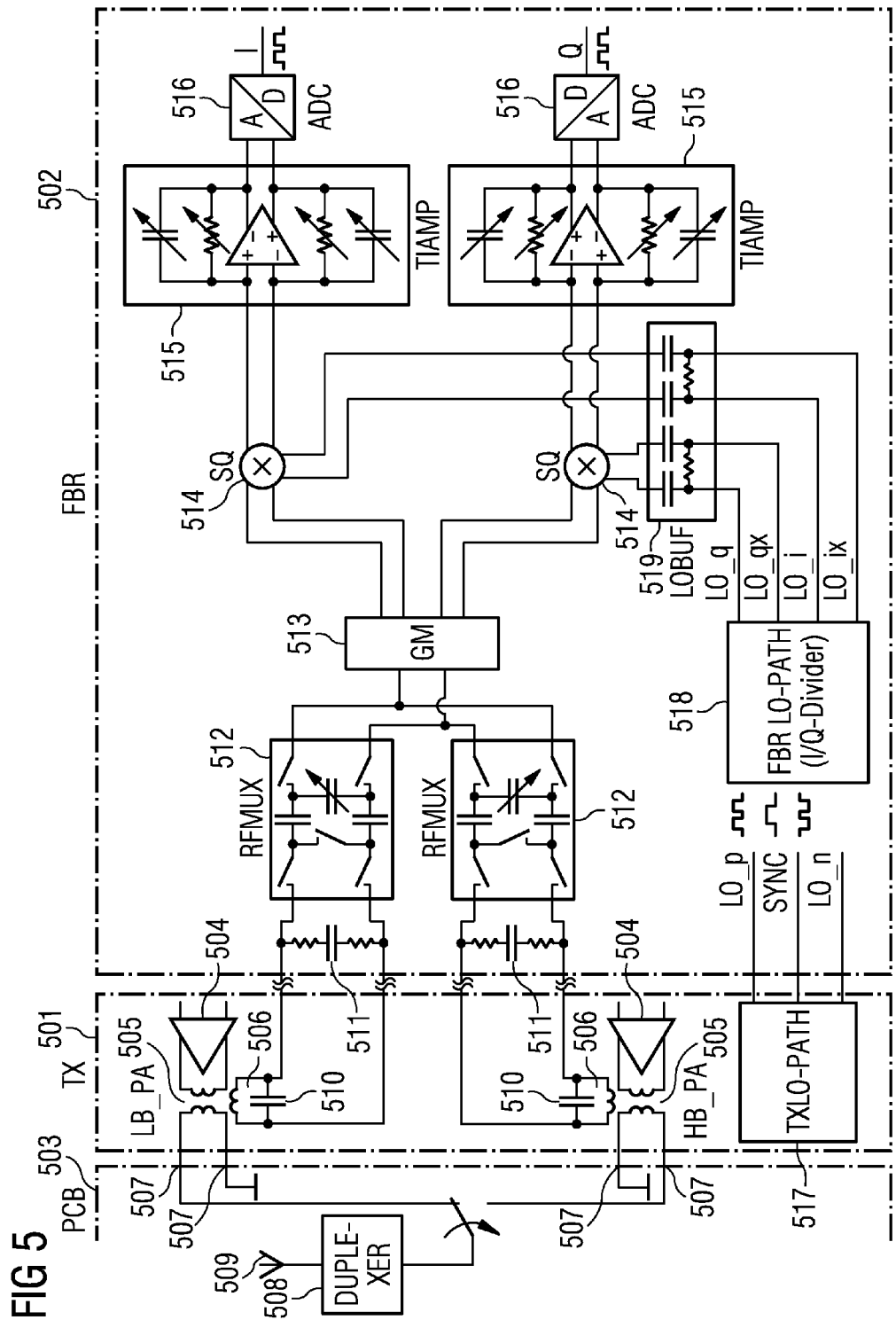
FIG. 5 shows a transmission arrangement having a vector demodulator.

FIG. 5 shows a transmission arrangement 500.

The transmission arrangement has an amplifier 501, a feedback receiver 502 and an antenna arrangement 503.

In this example, two transmission paths are provided, for example for a band of lower frequencies (LB (low band)) and a band for higher frequencies (HB (high band)). Like the amplifier 302, the amplifier 501 has, for each transmission path, a differential amplifier 504 and an output transformer 505 which is provided with an output element 506. The amplified signals are supplied, via outputs 507, to the antenna arrangement 503 (for example via conductors on a board) which, in this example, has a duplexer 508 for the two transmission paths and an antenna 509.

A resonant circuit is produced by a capacitance 510 (that is to say a capacitance connected in parallel with the inductive output element) respectively connected downstream of the FBR output, thus making it possible to achieve frequency-selective signal output. The output signal is passed to the feedback receiver 502 via a low-loss line. In this example, output is provided for both transmission paths, that is to say for LB (low-band) frequencies and HB (high-band) frequencies, in order to improve this frequency selectivity.

The output signal is respectively filtered using a filter 511 and is attenuated using an attenuator 512, for example a switchable radio-frequency attenuator (RF attenuator).

In this example, the feedback receiver is in the form of a vector demodulator (IQ demodulator). This enables accurate analysis of the transmission amplitude and phase. In this example, the demodulator has the structure of a passive mixer and has a transconductance stage (GM stage) 513, a respective quadrature mixer (switching quad) 514 for the I component and Q component, a respective transimpedance amplifier (TIA) 515 for the I component and Q component, and a respective analog/digital converter 516 for the I component and Q component. The demodulator may also be implemented in another form.

The attenuated coupled transmission signal is supplied to the transconductance stage 515 and is successively processed by the mixers 514, the transimpedance amplifiers 515 and the analog/digital converters 516, with the result that the analog/digital converters 516 output the I component and the Q component of the transmission signal.

The mixers 514 are supplied with the mixing frequencies by an oscillator 517 via an oscillator path 518 of the feedback receiver (which provides an oscillator signal having a different phase angle depending on the I component and Q component) and an oscillator buffer circuit 519.

The I component and the Q component are supplied, for example, to analysis components for determining a signal property and for controlling transmission based on the signal property. Depending on the implementation, highly accurate resolution of the measured transmission signal in terms of magnitude and phase is possible.

For example, information relating to the signal, derived from the I component and the Q component, can be used by a digital predistorter (DPD (digital predistortion)) connected upstream of the transmitter. The example shown here enables a cost-effective implementation with a low power loss.

Owing to the broadband design of the demodulator and the fact that, although the reduced-area implementation of the output as a result of the symmetrical design suppresses the H2 (second harmonic) well, it has a relatively low quality and therefore a wide bandwidth overall, uneven harmonics of the output signal are directly mixed into the baseband in this example. In order to sufficiently suppress these interfering signals, band-stop filters in the form of the filters 511 are connected downstream of the output. These band-stop filters are implemented, for example, using an area-efficient LC resonator which suppresses, in particular, the third harmonic of the fundamental (of the transmission frequency).

The attenuators 512 enable a maximum desired FBR dynamic response despite production-related scattering of the input power. The attenuators 512 additionally perform the function of radio-frequency multiplexers (RFMUX) which supply the output LB signal or the output HB signal to the transconductance stage. The attenuators are implemented, for example, using switchable capacitances. As a result, they may be implemented in a low-noise and highly linear manner. The mixer dynamic response can be maximized by means of programmability of the transconductance stage 513 and transimpedance of the transimpedance amplifiers 515.

Alternatives to the output illustrated in FIG. 4 are illustrated in FIG. 6.

FIG. 6 shows transformers 601, 602 with inductive output.

Like the transformer 400, the transformers 601, 602 have a primary winding 603 and a secondary winding 604.

In contrast to the transformer 400, the transformers 601, 602 have an output element 605 with a single inductance (differential coil) which, like in the example of the transformer 602, may also be arranged in an asymmetrical manner.

The one or more output coils (output inductances) 605 may also be placed outside the transformer in the vicinity of the turns. However, this may increase the space requirement and may asymmetrically load the transformer.

Output may also be implemented in the form of a complex filter inside the transformer. This is illustrated in FIG. 7.

Figure 7:
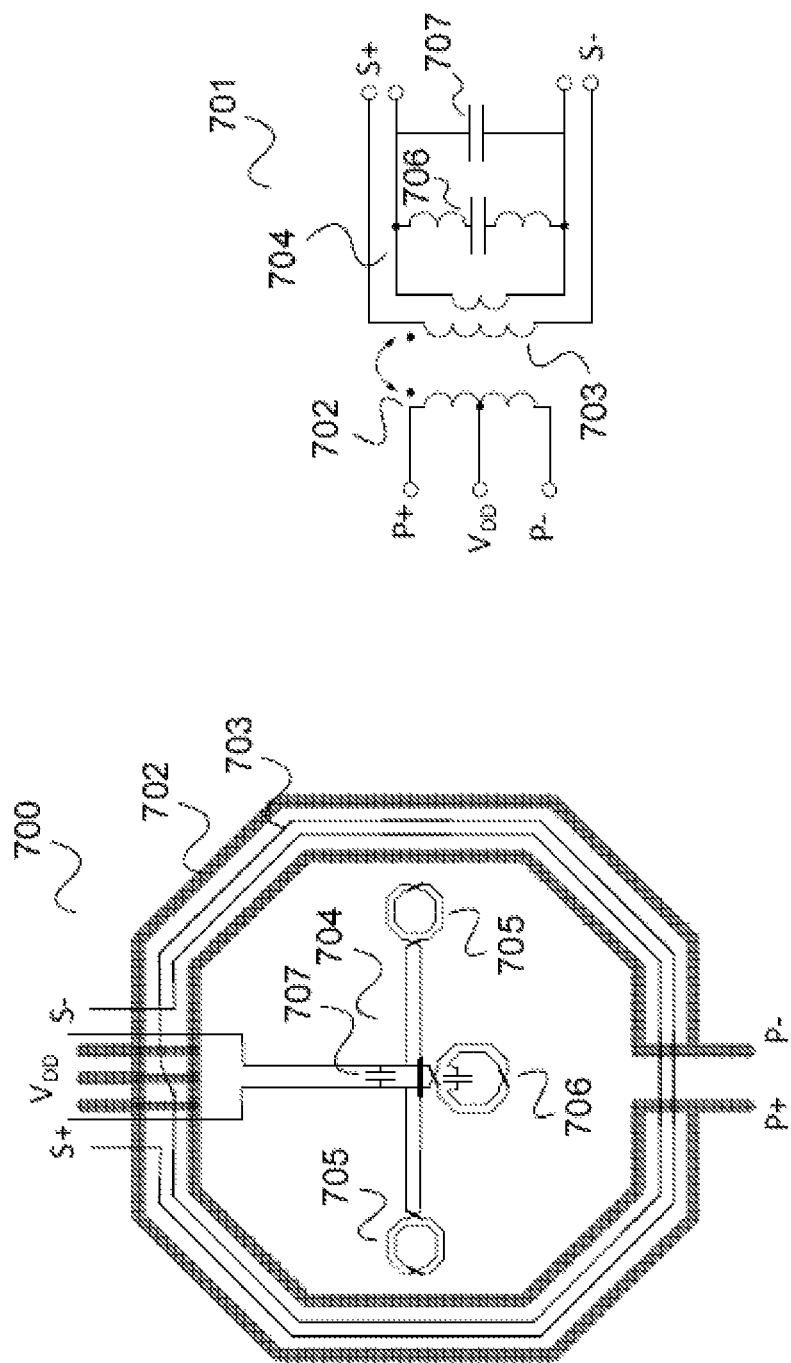
FIG. 7 shows a transformer with an integrated filter and a corresponding equivalent circuit diagram.

FIG. 7 shows a transformer 700 with an integrated filter and a corresponding equivalent circuit diagram 701.

Like the transformer 400, the transformer 700 has a primary winding 702, a secondary winding 703 and an output element 704.

In this example, the output element 704 has the form of a complex filter which is arranged inside the transformer 700. The output element 704 has two output inductances 705 like the inductances 408. The output element 704 also has a filter element 706 which has two further inductances with an interposed capacitance and implements, for example, an H3 stop (band-stop filter for suppressing the third harmonic) and corresponds, for example, to the filter 511. The output element 704 also has a further capacitance 707, for example a tuning capacitance corresponding to the capacitance 510. The integration of the filter and the tuning capacitance in the transformer enables a further area reduction.

Instead of a simple differential coupler structure, the output can also be implemented using a directional coupler integrated in the transformer. The use of such a structure then allows not only simple signal demodulation but also makes it possible to provide information relating to the (antenna) mismatch.

The transmission signal can also be output capacitively instead of by means of inductive coupling. For example, it is possible to use capacitive dividers which are integrated in one or more tuning capacitances of the transformer. Possible arrangements of a capacitive output element are illustrated in FIG. 8.

Figure 8:
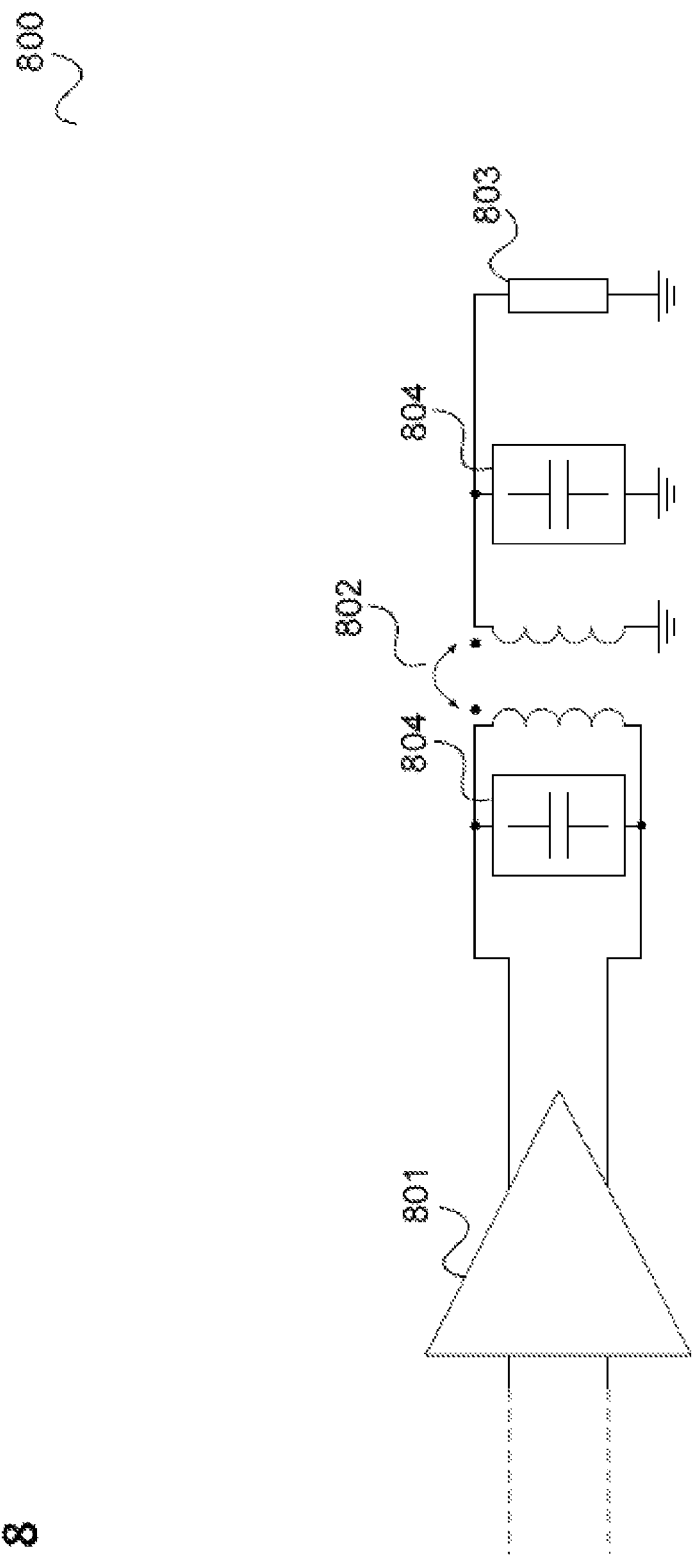
FIG. 8 shows an amplifier output path and a possible arrangement of a capacitive output element.

FIG. 8 shows an amplifier output path 800.

The amplifier output path 800 which is arranged at the output of a differential amplifier 801, for example corresponding to the differential amplifier 309, has an output transformer 802. The output path also has a load 803, for example formed by the transmission antenna. A capacitive output element 804 may be arranged in parallel with the primary winding or in parallel with the secondary winding of the output transformer 802.

Figure 9:
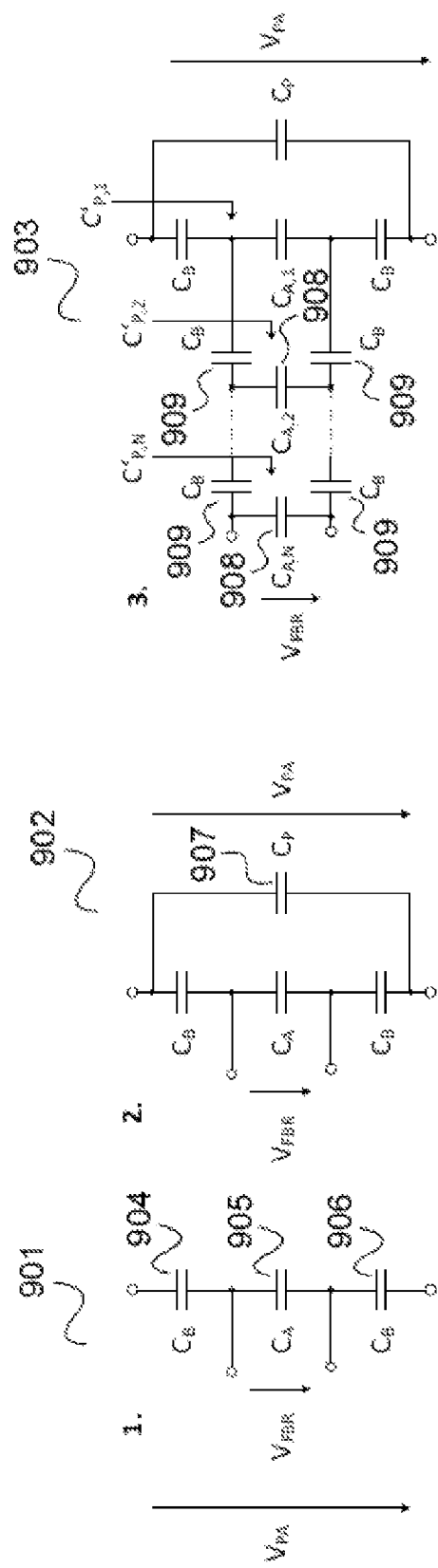
FIG. 9 shows three examples of capacitive output elements.

FIG. 9 shows capacitive output elements 901, 902, 903.

The first output element 901 has three capacitances 904, 905, 906 which are connected in series, the connections of the central capacitance 905 forming the outputs of the output element (for connection to the inputs of the feedback receiver) and the outer connections of the series circuit forming the connections for coupling to the connections of the primary winding or the secondary winding of the output transformer 802.

In comparison with the first output element 901, the second output element 902 also has a further capacitance 907 connected in parallel with the series circuit including the three capacitances.

In comparison with the second output element 902, the third output element 903 also has one or more further capacitances 908 coupled in parallel with the central capacitance of the series circuit, each of these further capacitances 908 being coupled, at each of their connections, to the preceding further capacitance 908 or the central capacitance 905 by means of a capacitance 909. The connections of the last further capacitance 908 (that is to say the further capacitance 908 which is furthest to the left in FIG. 9) form the outputs of the output element 900.

However, the common-mode components cannot be reduced according to the divider ratio or also cannot be suppressed at all by means of differential capacitive structures. Dividers with a ground reference or with an additional common-mode filter structure, as illustrated in FIG. 10, are able to achieve this.

Figure 10:
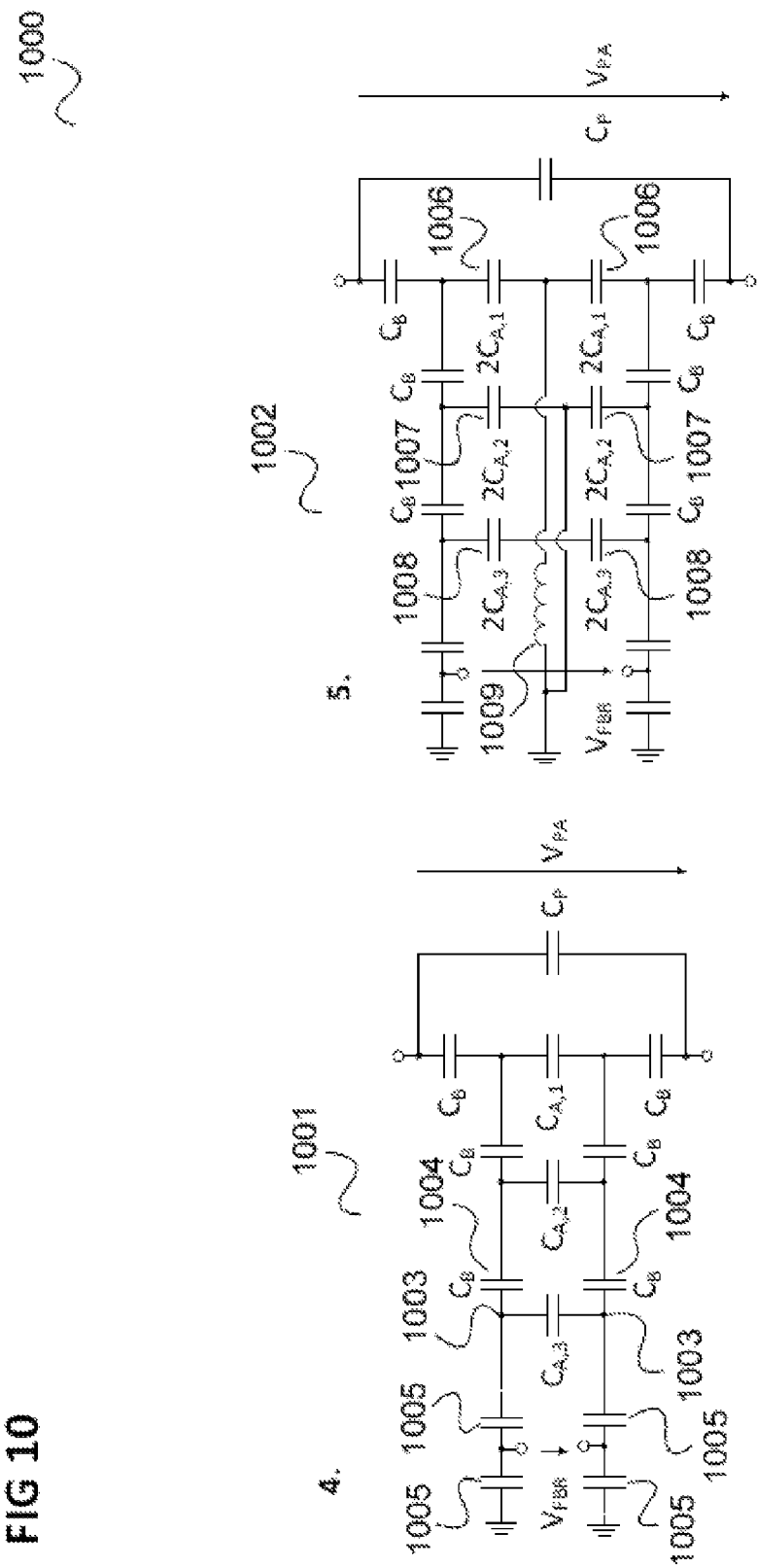
FIG. 10 shows two further examples of capacitive output elements.

FIG. 10 shows a fourth capacitive output element 1001 and a fifth capacitive output element 1002.

In comparison with the third output element 903, the connections 1003 of the last further capacitance 1004 are each connected to ground in the fourth output element 1001 by means of a series circuit including two capacitances 1005, the outputs of the output element 1001 being formed by the respective connecting nodes of the capacitances 1005.

In comparison with the fourth output element 1001, the central capacitance and the further capacitances are each separated into two capacitances 1006, 1007, 1008 in the fifth output element 1002, the connecting node of the capacitances 1006, into which the central capacitance is separated, being connected to ground by means of an inductance 1009 and the connecting node of the capacitances 1007, into which the first further capacitance (that is to say the capacitance furthest to the right in FIG. 10) is separated, being directly connected to ground.

The output power can also be measured (that is to say the power of the transmission signal can be determined) using current output instead of by means of a voltage measurement by the feedback receiver 502. The required low input impedance of the feedback element 502 can be achieved by removing the GM stage 513, as illustrated in FIG. 11.

Figure 11:
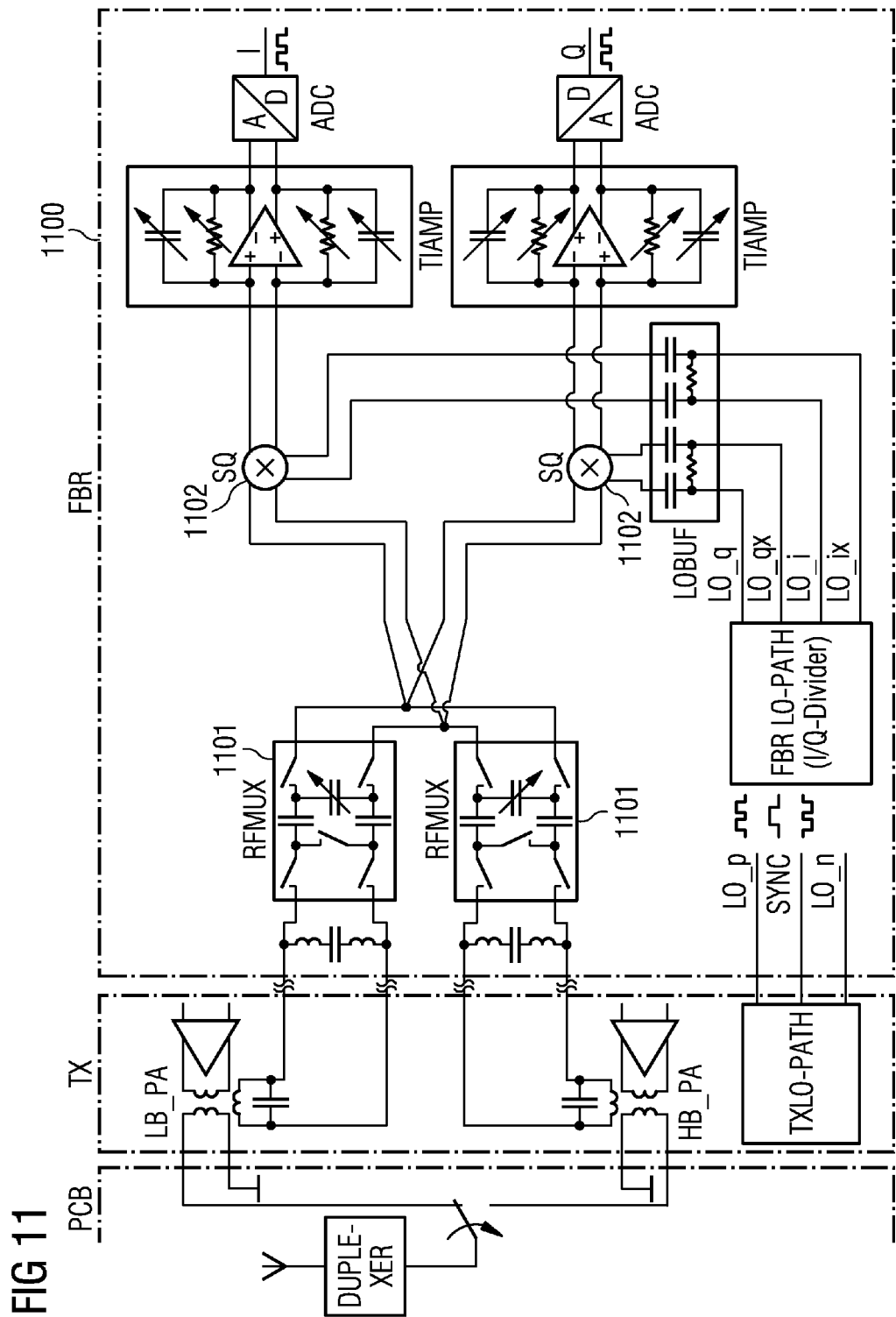
FIG. 11 shows a transmission arrangement with current output.

FIG. 11 shows a transmission arrangement 1100.

The transmission arrangement 1100 differs from the transmission arrangement 500 in that the transconductance stage 513 is not present and the outputs of the attenuators 1101 are directly coupled to the mixers 1102.

Figure 12:
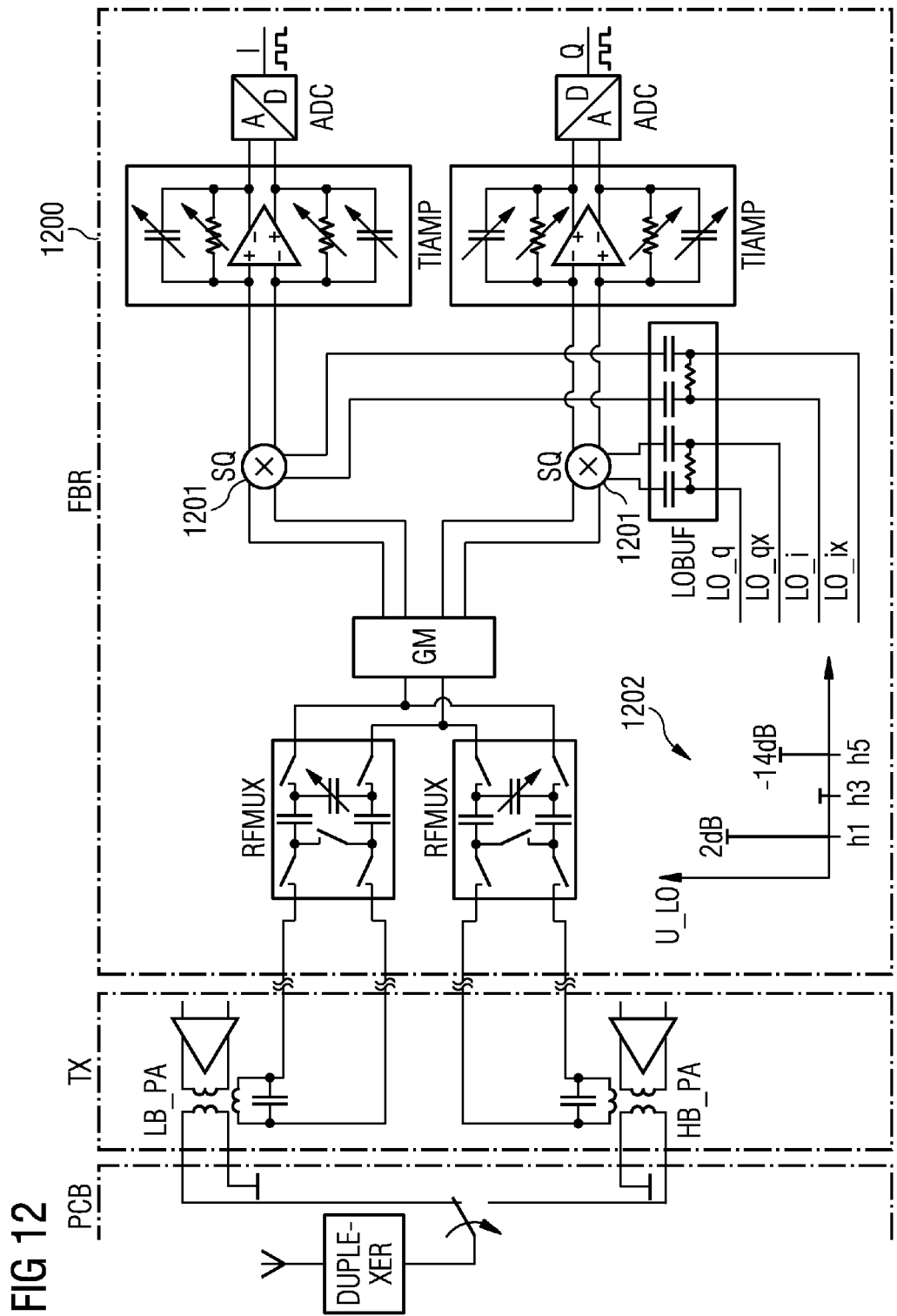
FIG. 12 shows a transmission arrangement having a polyphase oscillator.

The third harmonic can also be sufficiently suppressed during the mixing operation using a polyphase approach in the oscillator path of the feedback receiver 502, with the result that it is possible to dispense with the LC band-stop filters in the input path (that is to say the filters 511), as illustrated in FIG. 12.

FIG. 12 shows a transmission arrangement 1200.

The transmission arrangement 1200 differs from the transmission arrangement 500 in that the mixers 1201 are controlled in such a manner that the third harmonic is suppressed (as illustrated by the frequency spectrum 1202 of the signal supplied to the mixers 1201) and the filters 511 are dispensed with.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A transmission arrangement, comprising:
an amplifier which is set up to amplify a transmission signal and to provide it as an amplified transmission signal in differential form;
an analysis circuit for determining a property of the amplified transmission signal;
a differential feedback path which is set up to supply the amplified transmission signal to the analysis circuit in differential form; and
an output element which is set up to output the amplified transmission signal from an output path of the amplifier and to supply it to the feedback path;
wherein the output path has a matching network and the output element is set up to inductively output the amplified transmission signal from the matching network.

2. The transmission arrangement of claim 1,
wherein the analysis circuit comprises a feedback receiver configured to receive the amplified transmission signal in differential form.

3. The transmission arrangement of claim 1,
wherein the feedback receiver and the amplifier are arranged in a package.

4. The transmission arrangement of claim 1,
wherein the feedback receiver and the amplifier are arranged on a chip.

5. The transmission arrangement of claim 1,
wherein the transmission signal is a modulated transmission signal; and
wherein the feedback receiver has a demodulator which is set up to demodulate the amplified transmission signal.

6. The transmission arrangement of claim 1, further comprising:
a transmission device which is set up to generate the transmission signal.

7. The transmission arrangement of claim 6,
wherein the transmission device, the analysis circuit and the amplifier are arranged in a package.

8. The transmission arrangement of claim 6,
wherein the transmission device, the analysis circuit and the amplifier are arranged on a chip.

9. The transmission arrangement of claim 6, further comprising:
a control device which is set up to control the transmission device for transmission signal generation on the basis of the determined property.

10. The transmission arrangement of claim 1,
wherein the amplifier is set up to provide an antenna with the amplified transmission signal.

11. The transmission arrangement of claim 1,
wherein the differential feedback path has a filter for filtering the amplified transmission signal.

12. The transmission arrangement of claim 1,
wherein the differential feedback path has an attenuator for attenuating the amplified transmission signal.

13. The transmission arrangement of claim 1,
wherein the matching network is a transformer and the output element is set up to inductively output the amplified transmission signal from the secondary side of the transformer.

14. The transmission arrangement of claim 13,
wherein the output element is integrated in the transformer.

15. The transmission arrangement of claim 14,
wherein the output element has an output filter.

16. The transmission arrangement of claim 1,
wherein the amplifier is an output stage.

17. A transmission arrangement, comprising:
an amplifier which is set up to amplify a transmission signal and to provide it as an amplified transmission signal in differential form;
an analysis circuit for determining a property of the amplified transmission signal;
a differential feedback path which is set up to supply the amplified transmission signal to the analysis circuit in differential form; and
an output element which is set up to output the amplified transmission signal from an output path of the amplifier and to supply it to the feedback path;
wherein the output element is set up to capacitively output the amplified transmission signal.

18. A method for analyzing an amplified transmission signal, the method comprising:
amplifying a transmission signal and providing the amplified transmission signal in differential form;
supplying the amplified transmission signal to an analysis circuit in differential form;
wherein the amplified transmission signal in differential form is inductively supplied via a differential feedback path to the analysis circuit from an output path of an output element having a matching network; and
determining a property of the amplified transmission signal.

19. The method of claim 18,
wherein the transmission signal is a modulated transmission signal and the method further comprises demodulating the amplified transmission signal.

20. The method of claim 18, further comprising:
controlling the generation of the transmission signal based on the determined property.

21. A method for analyzing an amplified transmission signal, the method comprising:
amplifying a transmission signal and providing the amplified transmission signal in differential form;
supplying the amplified transmission signal to an analysis circuit in differential form;

wherein the amplified transmission signal in differential form is capacitively supplied via a differential feedback path to the analysis circuit from an output path of an output element having a matching network; and determining a property of the amplified transmission signal.

* * * * *